(12) United States Patent
Pernpeintner

(10) Patent No.: US 12,074,582 B2
(45) Date of Patent: Aug. 27, 2024

(54) ELECTROACOUSTIC RESONATOR

(71) Applicant: RF360 SINGAPORE PTE. LTD, Republic Plaza (SG)

(72) Inventor: Matthias Pernpeintner, Munich (DE)

(73) Assignee: RF360 Singapore Pte. Ltd., Singapore (SG)

( * ) Notice: Subject to any disclaimer, the term of this patent is extended or adjusted under 35 U.S.C. 154(b) by 282 days.

(21) Appl. No.: 17/597,467

(22) PCT Filed: Jul. 14, 2020

(86) PCT No.: PCT/EP2020/069907
§ 371 (c)(1),
(2) Date: Jan. 6, 2022

(87) PCT Pub. No.: WO2021/023484
PCT Pub. Date: Feb. 11, 2021

(65) Prior Publication Data
US 2022/0286106 A1 Sep. 8, 2022

(30) Foreign Application Priority Data
Aug. 2, 2019 (DE) ...................... 10 2019 120 942.0

(51) Int. Cl.
*H03H 9/02* (2006.01)
*H03H 9/15* (2006.01)
(Continued)

(52) U.S. Cl.
CPC .......... *H03H 9/02992* (2013.01); *H03H 9/15* (2013.01); *H03H 9/25* (2013.01); *H10N 30/87* (2023.02)

(58) Field of Classification Search
None
See application file for complete search history.

(56) References Cited

U.S. PATENT DOCUMENTS

| 7,576,471 B1 * | 8/2009 | Solal ................... H03H 9/1457 310/313 B |
| 7,939,989 B2 * | 5/2011 | Solal ................... H03H 9/1452 310/313 C |

(Continued)

FOREIGN PATENT DOCUMENTS

| DE | 102010046087 A1 | 8/2011 |
| WO | 2011088904 A1 | 7/2011 |

(Continued)

OTHER PUBLICATIONS

International Search Report and Written Opinion—PCT/EP2020/069907—ISA/EPO—Oct. 27, 2020.

(Continued)

*Primary Examiner* — Kenneth B Wells
(74) *Attorney, Agent, or Firm* — Polsinelli

(57) ABSTRACT

An electroacoustic resonator comprises a substrate (3) with a piezoelectric material and an interdigital electrode structure on a top side (33) of the substrate. The electrode structure comprises a first electrode (1) and a second electrode (2) each with a busbar (20) and a plurality of fingers (10). The fingers of both electrodes interdigitate. The region of the top side between the two busbars is subdivided into two barrier regions (113), two trap regions (112) and one track region (111), the trap regions being located between the two barrier regions and the track region being located between the two trap regions. At least some fingers each comprise one barrier portion (13), two trap portions (12) and one track portion (11), wherein the barrier portion is associated with the barrier region closest to the busbar assigned to the finger, the trap portions are each associated with one of the trap regions and the track portion is associated with the track region. The fingers are configured such that the velocity of a main mode of surface acoustic waves is smaller in the trap regions than in the track region. Each electrode (Continued)

Figure 1:
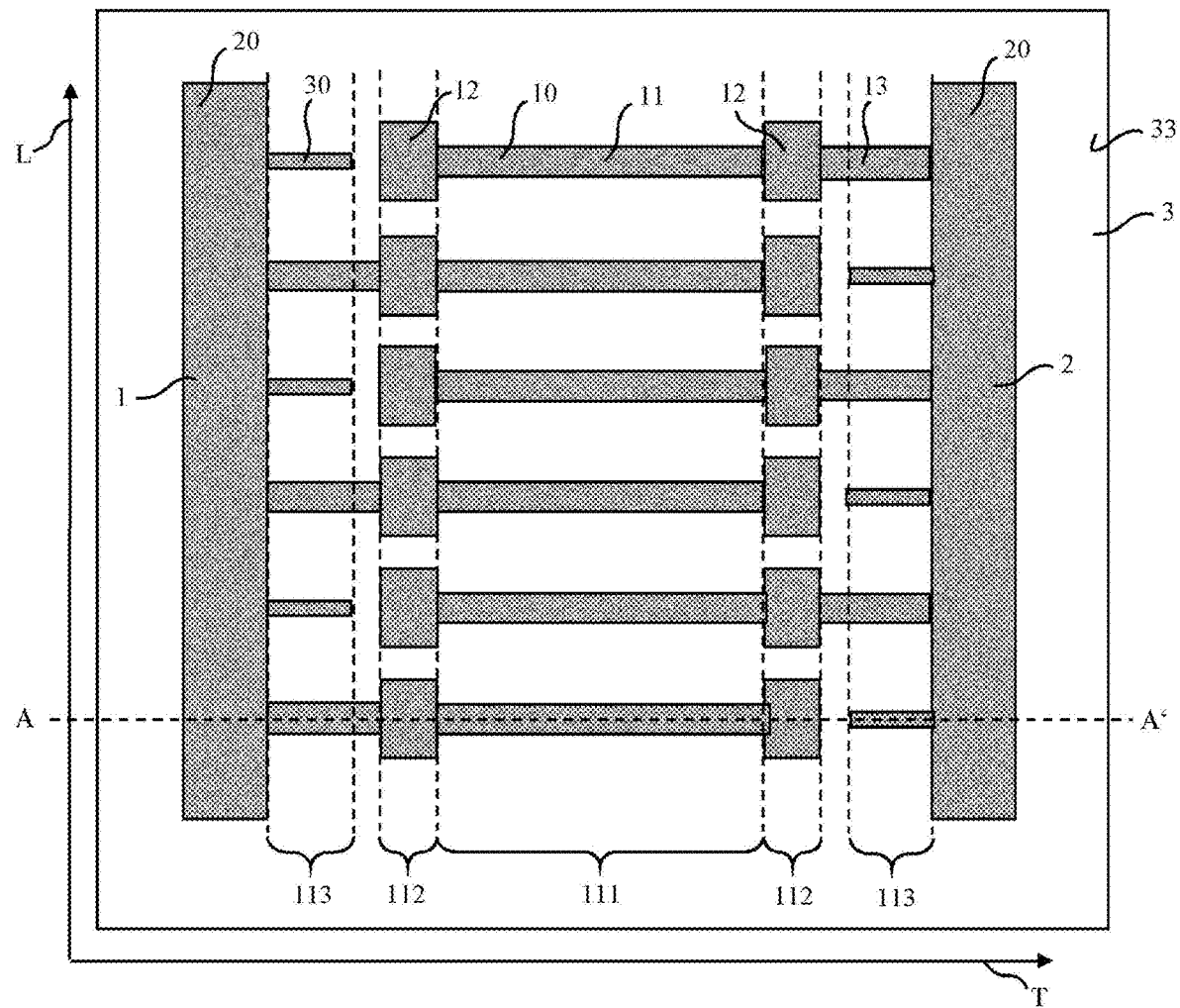

comprises a plurality of stub fingers (30) being shorter than the fingers. Each stub finger is associated only with the barrier region closest to the busbar assigned to the stub finger. The electrodes are configured such that a velocity of the main mode in the barrier regions is greater than in the track region.

10 Claims, 3 Drawing Sheets

(51) Int. Cl.
      *H03H 9/25*       (2006.01)
      *H10N 30/87*       (2023.01)

(56) References Cited

U.S. PATENT DOCUMENTS

| | | | | |
|---|---|---|---|---|
| 8,294,331 | B2* | 10/2012 | Abbott | H03H 9/1452 |
| | | | | 29/25.35 |
| 8,390,400 | B2* | 3/2013 | Kando | H03H 9/14594 |
| | | | | 310/313 C |
| 9,257,960 | B2* | 2/2016 | Ruile | H03H 9/1457 |
| 10,862,452 | B2* | 12/2020 | Okada | H03H 9/14532 |
| 2013/0051588 | A1 | 2/2013 | Ruile et al. | |
| 2016/0072475 | A1 | 3/2016 | Mimura et al. | |

FOREIGN PATENT DOCUMENTS

| | | |
|---|---|---|
| WO | 2012132238 A1 | 10/2012 |
| WO | 2014192756 A1 | 12/2014 |

OTHER PUBLICATIONS

Solal M., et al., "A Method to Reduce Losses in Buried Electrodes RF Saw Resonators", Ultrasonics Symposium (IUS), 2011 IEEE International, IEEE, Oct. 18, 2011, XP032230328, pp. 324-332, DOI: 10.1109/ULTSYM.2011.0078, ISBN: 978-1-4577-1253-1, pp. 324-332, figures 1A. 1B. 13, p. 327. Left-Hand column—p. 329, Left-Hand Column, Figures 11-16.

* cited by examiner

ELECTROACOUSTIC RESONATOR

An electroacoustic resonator is specified.

One task to be solved is to specify an electroacoustic resonator with few spurious modes.

According to at least one embodiment, the electroacoustic resonator comprises a substrate with a piezoelectric material. The substrate may be formed of the piezoelectric material or may comprise a layer, for example a thin-film, of the piezoelectric material. For example, the piezoelectric material is lithium tantalite, like e.g. $LiTaO_3$, or lithium niobate, like e.g. $LiNbO_3$, or AlN or quartz.

According to at least one embodiment, the electroacoustic resonator comprises an interdigital electrode structure on a top side of the substrate. The interdigital electrode structure is preferably a metal structure. For example, the electrode structure is made of a metal, like Cu or Al or Pt or Ag or Au or Ti or Cr, or of a compound or of a metal alloy thereof. The top side of the substrate is preferably formed of the piezoelectric material. The interdigital electrode structure may be covered with additional layers of dielectric material, e.g. $SiO_2$ or $Si_3N_4$, in order to provide temperature compensation, passivation or other additional functionalities.

According to at least one embodiment, the electrode structure comprises a first electrode and a second electrode each with a busbar and a plurality of fingers. The fingers of each electrode are electrically connected by the busbar of the electrode. The electrodes may each consist of a single material or may have a layered structure. The fingers are preferably formed integrally with the assigned busbar. The electrodes are preferably in direct contact with the piezoelectric material, or they are separated from the piezoelectric material by a thin layer of insulating material. For example, each electrode comprises at least ten or at least 50 or at least 100 fingers.

The busbars of both electrodes run parallel or essentially parallel to each other. The main extension direction of the busbars preferably runs parallel to the longitudinal direction. A direction parallel to the top side and perpendicular to the longitudinal direction is defined as a transversal direction. The fingers of the electrodes extend transversely to the busbar, for example with a main extension direction of each finger running parallel to the transversal direction. Preferably, all the fingers run parallel or essentially parallel to each other.

According to at least one embodiment, the fingers of both electrodes interdigitate. However, the fingers of different electrodes are electrically isolated from each other. In other words, the electrodes are interdigital electrodes. Both electrodes together define an interdigital transducer of the electroacoustic resonator. For example, the electroacoustic resonator is a SAW resonator.

According to at least one embodiment, the region of the top side between the two busbars is subdivided into two barrier regions, two trap regions and one track region. The trap regions are located between the two barrier regions and the track region is located between the two trap regions. The regions are preferably each a contiguous, strip-like region with a main extension direction parallel to the longitudinal direction. Along the transversal direction, the regions are arranged one after the other.

According to at least one embodiment, at least some fingers, preferably all fingers, each comprise one barrier portion, two trap portions and one track portion. The barrier portion is associated with the barrier region closest to the busbar assigned to the finger. The trap portions are each associated with one of the trap regions. The track portion is associated with the track region. Here, a portion is associated with a region if, in a plan view onto the top side of the substrate, the portion overlaps with the region, preferably overlaps completely with the region. The association between a portion and a region is particularly one-to-one. A busbar is assigned to a finger, if the busbar belongs to the same electrode as the finger.

In other words, starting from the assigned busbar, at least some fingers each comprise a barrier portion, followed by a first trap portion, followed by a track portion, followed by a second trap portion. The second trap portion preferably forms the end of the finger remote from the busbar. Preferably, the fingers each consist only of these four portions. Particularly preferably, the width of the fingers, measured as an expansion of the finger along the longitudinal direction, is constant within each portion. "Constant" means constant within the manufacturing tolerance. However, in different portions, the width of the fingers may be different. Preferably, also the height of the fingers, measured as the expansion perpendicular to the top side, is constant within each portion but may be different in different portions.

According to at least one embodiment, the fingers are configured such that a velocity of a main mode of surface acoustic waves is smaller in the trap regions than in the track region. Surface acoustic waves propagate at the top side of the substrate. The main mode is a surface acoustic wave propagating along the longitudinal direction and having a certain polarization. For example, the main mode is a Rayleigh surface acoustic wave. Preferably, the velocity of the main mode in the trap regions is at most 99% or at most 98% or at most 97% of the velocity of the main mode in the track region. Additionally or alternatively, the velocity of the main mode in the trap regions is at least 93% or at least 94% or at least 95% of the velocity in the track region.

During the intended operation, the electroacoustic resonator generates the main mode, which is the wanted surface acoustic wave. The resonator is configured such that, during operation, the main mode is created inside the track region and is trapped inside the track region.

According to at least one embodiment, each electrode comprises a plurality of stub fingers. The stub fingers are shorter than the fingers, i.e. the stub fingers have a smaller length than the fingers. The length of a finger/stub finger or of a portion of a finger is the expansion along the transversal direction. Each electrode may comprise at least ten or at least 50 or at least 100 stub fingers.

The stub fingers extend from the same side of the assigned busbar as the fingers. This means that the stub fingers and the fingers of an electrode extend from the assigned busbar towards the busbar of the other electrode. The stub fingers may all have the same shape within the limits of manufacturing tolerance. Likewise, the fingers comprising the different portions may all have the same shape within the limits of manufacturing tolerance.

According to at least one embodiment, each stub finger is associated only with the barrier region closest to the busbar assigned to the stub finger. Particularly, the stub fingers do not overlap with the trap regions and the track region. The widths of the barrier regions, measured perpendicular to the longitudinal direction, is preferably defined by the length of the assigned stub fingers.

According to at least one embodiment, the electrodes are configured such that the velocity of the main mode in the barrier regions is greater than in the track region. For example, the velocity of the main mode in the barrier regions is at least 101% or at least 102% or at least 104% or at least 106% of the velocity in the track region. Additionally or alternatively, the velocity of the main mode in the barrier regions is at most 110% or at most 109% or at most 107% or at most 105% of the velocity in the track region.

The velocity in the barrier regions is reduced compared to a resonator with a piston mode design of the fingers but without the stub fingers. The reduction of the velocity in the barrier regions allows to increase the velocity in the trap regions which further allows the suppression of unwanted modes.

In at least one embodiment, the electroacoustic resonator comprises a substrate with a piezoelectric material and an interdigital electrode structure on a top side of the substrate. The electrode structure comprises a first electrode and a second electrode each with a busbar and a plurality of fingers. The fingers of both electrodes interdigitate. The region of the top side between the two busbars is subdivided into two barrier regions, two trap regions and one track region, the trap regions being located between the two barrier regions and the track region being located between the two trap regions. At least some fingers each comprise one barrier portion, two trap portions and one track portion, wherein the barrier portion is associated with the barrier region closest to the busbar assigned to the finger, the trap portions are each associated with one of the trap regions and the track portion is associated with the track region. The fingers are configured such that the velocity of a main mode of surface acoustic waves is smaller in the trap regions than in the track region. Each electrode comprises a plurality of stub fingers being shorter than the fingers. Each stub finger is associated only with the barrier region closest to the busbar assigned to the stub finger. The electrodes are configured such that a velocity of the main mode in the barrier regions is greater than in the track region.

In electroacoustic resonators, several unwanted (spurious) modes are present besides the wanted main mode. These unwanted modes are modes which are not propagating along the main mode propagation direction (=longitudinal direction) and which may have all possible polarizations as well as modes with the same propagation direction as the main mode but of different polarization than the main mode. In general, it is not possible to find a design of the electrode structure which allows the suppression of all unwanted modes. This is the case especially in material systems with high electroacoustic coupling and/or small distance between the main mode and differently polarized unwanted modes. In SAW filters composed of such resonators, the remaining unwanted modes may cause dips in the passband and at the filter skirts, group delay ripples, trimming problems and/or reduced power durability.

In order to suppress the unwanted transversal modes (i.e. modes with a non-vanishing propagation along the transversal direction perpendicular to the longitudinal direction), the fingers of the electrodes can be formed with a so-called piston mode design, in which the fingers are subdivided into a barrier portion, two trap portions and a track portion. The trap portions may be designed such that, in the associated trap regions, the velocity of the main mode is smaller than in the track region. This can be realized, for example, by using metal dots in the trap portions in order to increase the mass of the trap portions compared to the track portion. This, however, can be problematic for high frequency resonators, in which the pitch between adjacent fingers has to be small. The production methods often are not sufficiently accurate for placing metal dots on very small structures.

The inventors of the present invention had the idea to additionally use stub fingers in the electrodes. The stub fingers allow to reduce the velocity of surface acoustic waves propagating along the longitudinal direction in the barrier regions flanking the trap regions. As a consequence, the velocity in the trap regions does not have to be as small as without the stub fingers so that the usage of metal dots for the trap portions may not be needed at all. In this way, costs are saved and the fabrication limits due to dot alignment accuracy and minimum dot size are avoided.

A further advantage of the stub fingers is that they bring about a further degree of freedom when optimizing the resonator for the suppression of unwanted modes. Indeed, by adjusting the width and/or the length and/or the height of the stub fingers, the velocity of surface acoustic waves in the barrier regions can be adjusted and in this way the suppression of modes with transverse propagation directions can be optimized. Furthermore, by optimizing the design of the stub fingers, also the modes of unwanted polarizations can be further suppressed.

According to at least one embodiment, the width and/or height of the fingers is greater in the trap regions than in the track region. By increasing the width and/or height, the mass load of the fingers in the trap regions is increased compared to the track region due to which the velocity of the main mode in the trap regions is reduced compared to the track region. For example, for each finger, the width and/or height in the trap regions is at least 105% or at least 110% or at least 130% or at least 150% of the width and/or height in the track region. Additionally or alternatively, for each finger, the width and/or height in the trap regions is at most 250% or at most 200% or at most 150% of the width and/or height in track region.

According to at least one embodiment, the stub fingers and/or the barrier portions of the fingers are thinner and/or narrower than the track portions of the fingers. For example, the height and/or the width of the stub fingers and/or of the barrier portions is at most 90% or at most 80% or at most 70% of the height and/or width of the track portions. Additionally or alternatively, the height and/or width of the stub fingers and/or of the barrier portions is at least 20% or at least 40% or at least 50% of the height and/or width of the track portions.

By reducing the width and/or height of the stub fingers and/or of the barrier portions of the fingers, the mass load in the barrier regions can be reduced compared to the track region, as a consequence of which the velocity of the main mode is increased compared to the track region.

According to at least one embodiment, the stub fingers are shorter than the barrier portions. For example, the length of the stub fingers is at most 80% or at most 90% or at most 95% of the length of the barrier portions of the fingers. Additionally or alternatively, the length of the stub fingers is at least 70% or at least 80% of the length of the barrier portions.

According to at least one embodiment, the width and/or height of the stub fingers is the same as the width and/or height of the barrier portions of the fingers. Here and in the following, two elements having the same height and/or width and/or length means that the elements have the same height and/or width and/or length within the limits of the manufacturing tolerance. For example, deviations of at most 10% or at most 5% occur.

According to at least one embodiment, the height of the fingers in the trap portions is the same as in the track portions. In this case, the width of the fingers in the trap portions is preferably greater than in the track portions. Preferably, also the height of the stub fingers and of the fingers in the barrier portions is the same as in the track portions. In this case, the width of the stub fingers and/or of the barrier portions is preferably smaller than in the track portions.

Sufficiently deep trap regions, i.e. trap regions with a low velocity of the main mode, can in general be realized by using trap portions with an increased height, for example by the usage of metal dots. However, in high frequency resonators, small structure sizes are required. The application of metal dots may therefore be difficult. With the present invention, however, the trap portions can be chosen with the same height as the track portions, as the trap depth does not have to be chosen so deep due to the reduced main mode velocity in the barrier regions.

According to at least one embodiment, in each electrode, the fingers and the stub fingers are arranged in an alternating manner. Particularly, in each electrode, between each pair of fingers there is a stub finger and between each pair of stub fingers there is a finger.

According to at least one embodiment, each stub finger is located at the same height with respect to the propagation direction of the main mode, i.e. the longitudinal direction, as a finger of the respective other electrode. This means that a centerline through a stub finger, said centerline extending along the transversal direction, also runs through a finger of the other electrode. Preferably, the centerline of a stub finger is also the centerline of the finger of the other electrode at the same height. Preferably, the distance of each stub finger to the finger of the other electrode being located at the same height is at most 10% or at most 5% of the distance between the two busbars. Additionally or alternatively, the distance of each stub finger to the finger of the other electrode at the same height is at most $0.5 \cdot \lambda$ or at most $0.4 \cdot \lambda$ or at most $0.3 \cdot \lambda$, where $\lambda$ is the wavelength of the main mode in the track region. The distance between two objects is here defined as the length of the shortest connection between the two objects.

According to at least one embodiment, the electroacoustic resonator is part of a RF filter. The RF filter may be used in a communication device, for example a mobile phone. The RF filter may be a band pass filter. A resonance frequency of the electroacoustic resonator is for example at least 0.4 GHz or at least 2.5 GHz or at least 6 GHz or at least 8 GHz.

Further preferred embodiments and developments of the electroacoustic resonator are described in the following in connection with the Figures. Equal or similar elements as well as elements of equal function are designated with the same reference signs in the Figures. The Figures and the proportions of the elements shown in the Figures are not regarded as being shown to scale. Rather, single elements, in particular layers, can be shown exaggerated in magnitude for the sake of better presentation and/or better understanding.

Figure 3:
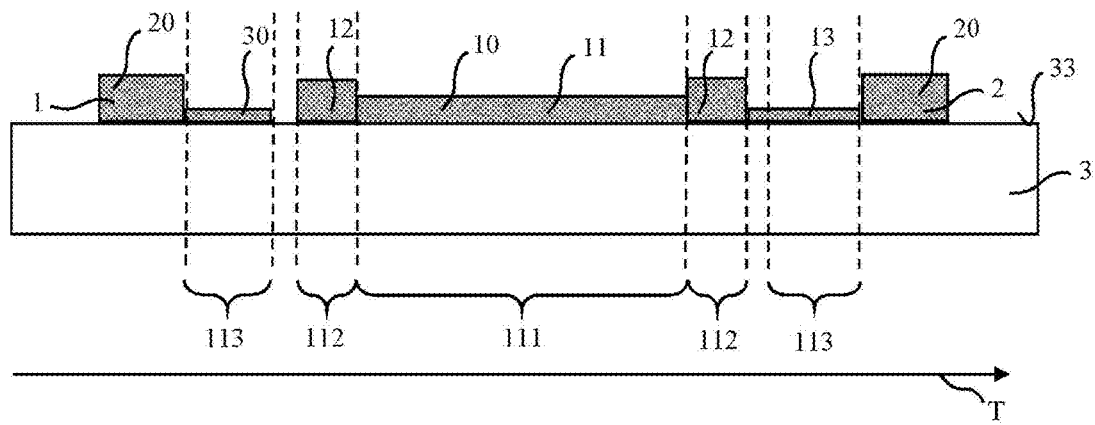
Figure 4:
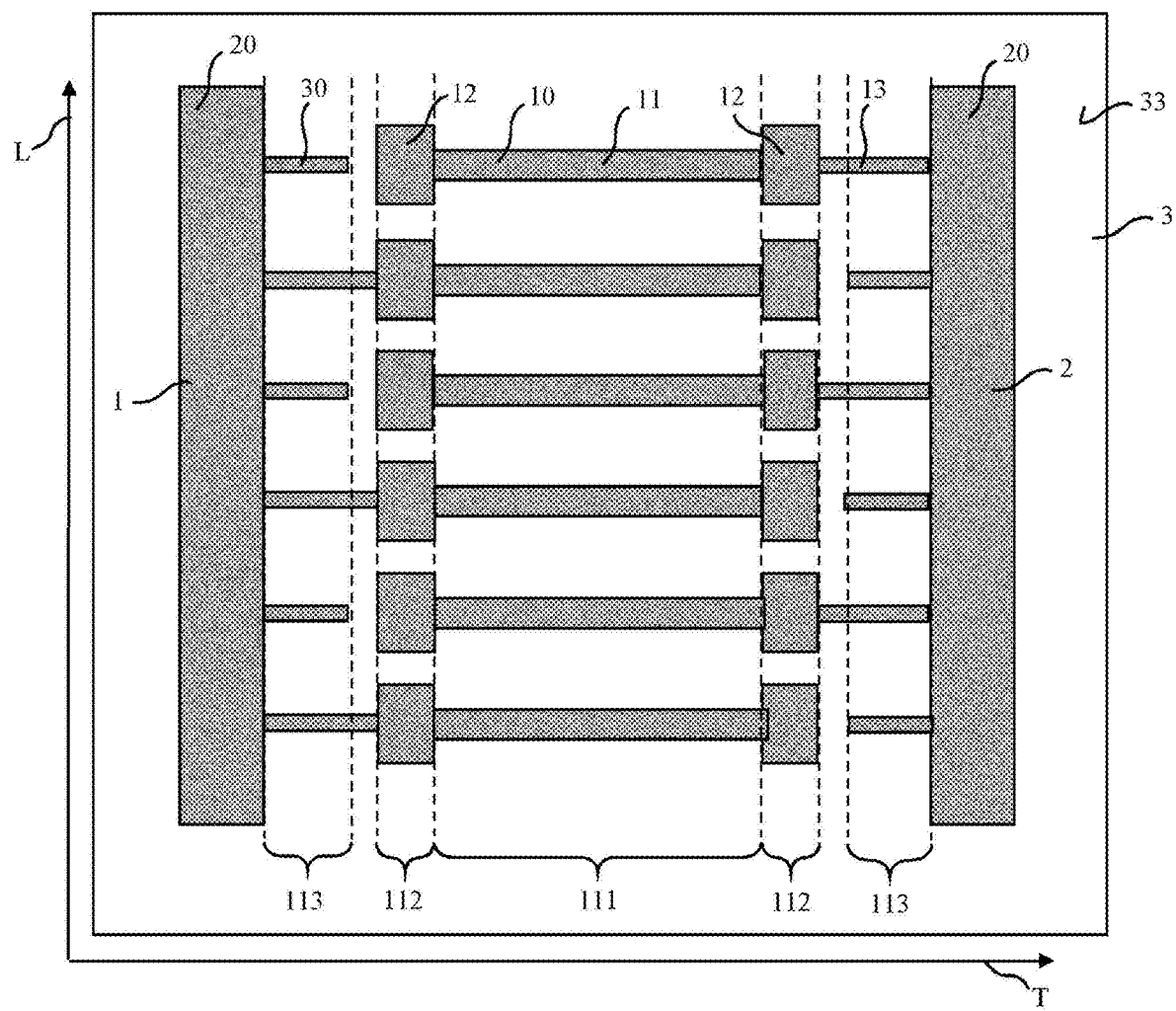
Figure 5:
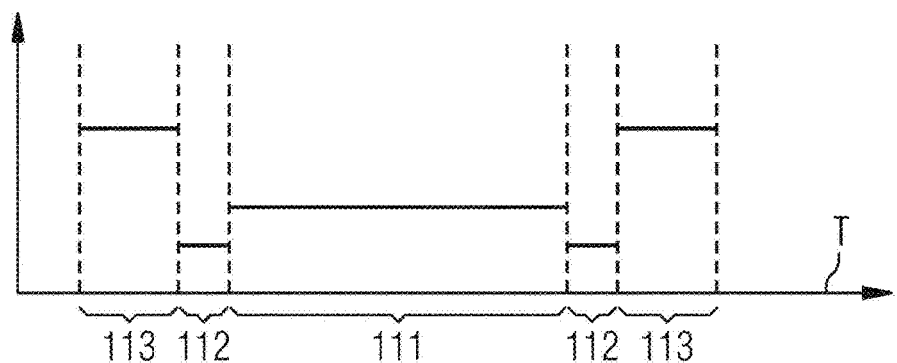
Figure 6:
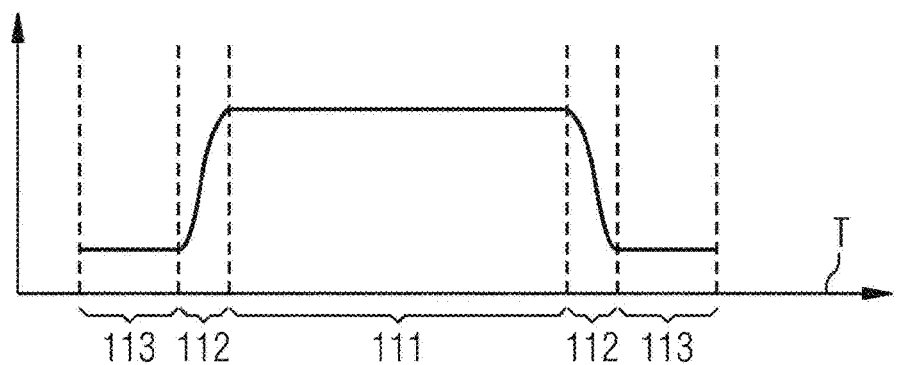

In the drawings:

FIGS. 1 to 4 show exemplary embodiments of the electroacoustic resonator in different views, and FIGS. 5 and 6 show characteristic properties of the electroacoustic resonator on the basis of graphs.

Figure 2:
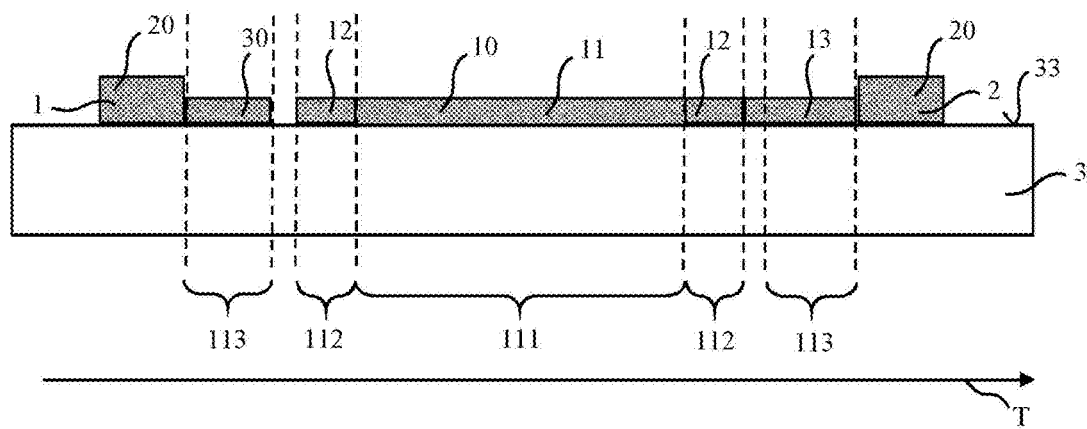

FIG. 1 shows a first exemplary embodiment of the electroacoustic resonator in a plan view. FIG. 2 shows the electroacoustic resonator of FIG. 1 in a cross-sectional view when cutting through the cut-plane AA'. The electroacoustic resonator comprises a substrate 3 with a piezoelectric material, for example LiNbO$_3$. The substrate 3 comprises a top side 33, which is made of the piezoelectric material. For example, the substrate 3 comprises a thin-film of the piezoelectric material. The cut angles of the piezoelectric material are, for example, (0°, 38°, 0°). The cut angles ($\lambda'$, $\mu$, $\theta$) are the Euler angles defining the orientation of a top surface of the piezoelectric material with respect to the crystallographic axes of the piezoelectric material. The definition is in accordance with the International Standard IEC 62276: 2016.

On the top side 33 of the substrate, an electrode structure is applied. The electrode structure is made of a metal, for example of Cu. The electrode structure comprises a first electrode 1 and a second electrode 2. Both electrodes 1, 2 comprise a busbar 20 and a plurality of fingers 10. The busbars 20 both extend along a longitudinal direction L. The fingers 10 extend perpendicularly to the busbars 20 along a transversal direction T, which is perpendicular to the longitudinal direction L.

Between the busbars 20, the top side 33 of the substrate 3 is subdivided into two barrier regions 113, two trap regions 112 and one track region 111. The regions 111, 112, 113 are all formed strip-like with a main extension direction along the longitudinal direction L. The regions 111, 112, 113 are arranged one after the other along the transversal direction T. The track region 111 is located between the two trap regions 112. The two trap regions 112 and the track region 111 are located between the two barrier regions 113. The barrier regions 113 are each adjacent to a busbar 20.

The fingers 10 each comprise a barrier portion 13, which is adjacent to the busbar 20 of the assigned electrode. In a direction away from the busbar 20, a first trap portion 12, a track portion 11 and a second trap portion 12 are in each case arranged downstream of the barrier portion 13 in this order. The barrier portion 13 is associated/overlaps with the barrier region 113 adjacent to the assigned busbar 20. The trap portions 12 are associated/overlap with the trap regions 112 and the track portion 11 is associated/overlaps with the track region 111.

Besides the fingers 10, each electrode 1, 2 comprises stub fingers 30 extending from the busbars 20. In each electrode 1, 2, one stub finger 30 is arranged between each pair of fingers 10. The stub fingers 30 are associated/overlap only with the barrier region 113 adjacent to the assigned busbar 20. With respect to the longitudinal direction L, each stub finger 30 lies on the same height as a finger 10 of the respective other electrode.

During operation of the electroacoustic resonator shown in FIGS. 1 and 2, a main mode of surface acoustic waves, propagating along the longitudinal direction with a certain polarization, is generated. The main mode is essentially trapped in the track region 111. The trap portions 12 of the fingers 10 are chosen such that in the trap regions 112 the velocity of the main mode is reduced compared to the track region 111. This is realized by forming the trap portions 12 to be broader than the track portions 11, which results in an increased mass load in the trap regions 112 compared to the track region 111. The height of fingers 10 in the track portions 12, however, is the same as in the track portion 11 (see FIG. 2), which is advantageous in view of the production of the fingers 10.

The stub fingers 30 are designed with a reduced width compared to the track portions 11. The barrier portions 13 of the fingers 10 have the same width as the track portions 11. The height of the stub fingers 30 and of the barrier portions 13 is the same as in the track portion 11. Due to the reduced width of the stub fingers 30, the velocity of the main mode in the barrier regions 113 is greater than in the track region 111 but smaller compared to the case where no stub fingers 30 are used.

The resulting velocity profile is shown in the graph of FIG. 5. The x-axis represents the transversal direction T. The y-axis represents the velocity of the main mode. During operation of the resonator, the velocity profile results in the profile of the amplitude of the main mode shown in the graph of FIG. 6. Also here, the x-axis represents the transversal direction T. The y-axis represents the amplitude of the main mode. As can be seen, due to the design of the electrode structure, the main mode amplitude almost has a rectangular shape with an almost flat shape in the track region 111 and steep flanks in the trap regions 112. With such a profile for the main mode, unwanted modes propagating in the transversal direction are almost completely suppressed. In FIGS. 5 and 6 the small gap regions between the track regions 112 and the barrier regions 113 visible in the previous figures are not indicated.

FIG. 3 shows a second exemplary embodiment of the electroacoustic resonator. The resonator is only shown in the cross-sectional view. A plan view would, for example, be the same as in FIG. 1. In contrast to the electroacoustic resonator of FIG. 2, the electroacoustic resonator of FIG. 3 has fingers 10 with a greater height in the trap portions 12 than in the track portions 11. This helps to further reduce the velocity of the main mode in the track regions 112. An increased height 12 may be used instead of an increased width. Furthermore, the height of the fingers 10 in the barrier portions 13 may be smaller than in the track portions 11. Similarly, the height of the stub fingers 30 may be smaller than the height of the fingers 10 in the track portions 11.

FIG. 4 shows a third exemplary embodiment of the electroacoustic resonator, now again in plan view on the top side 33 of the substrate 3. The electroacoustic resonator of FIG. 4 differs from the electroacoustic resonator of FIG. 1 in that also the width of the fingers 10 in the barrier portions 13 is now reduced compared to the width in the track portions 11. In this way, the velocity for the main mode in the barrier regions 113 is increased compared to the case of FIG. 1.

The electroacoustic resonators of FIGS. 3 and 4 have a similar characteristic velocity profile and a similar main mode amplitude profile as shown in FIGS. 5 and 6.

The invention described herein is not limited by the description in conjunction with the exemplary embodiments. Rather, the invention comprises any new feature as well as any combination of features, particularly including any combination of features in the patent claims, even if said feature or said combination per se is not explicitly stated in the patent claims or exemplary embodiments.

REFERENCE SIGN LIST 1 first electrodes
2 second electrodes
3 substrate
10 finger
11 track portion
12 trap portion
13 barrier portion
20 busbar
30 stub finger
33 top side
111 track region
112 trap region
113 barrier region
T transversal direction
L longitudinal direction

The invention claimed is:

1. An electroacoustic resonator, comprising:
a substrate with a piezoelectric material, and
an interdigital electrode structure on a top side of the substrate, wherein
the electrode structure comprises a first electrode and a second electrode each with a busbar and a plurality of fingers,
the fingers of both electrodes interdigitate,
a region of the top side between the two busbars is subdivided into two barrier regions, two trap regions and one track region, the trap regions being located between the two barrier regions and the track region being located between the two trap regions,
at least some fingers each comprise one barrier portion, two trap portions and one track portion, wherein the barrier portion is associated with the barrier region closest to the busbar assigned to the finger, the trap portions are each associated with one of the trap regions and the track portion is associated with the track region,
each electrode comprises a plurality of stub fingers being shorter than the fingers,
each stub finger is associated only with the barrier region closest to the busbar assigned to the stub finger,
each stub finger and the one barrier portion of the at least some fingers have a first thickness;
the one track portion of the at least some fingers has a second thickness greater than the first thickness; and
the two trap portions of the at least some fingers have a third thickness greater than the second thickness.

2. The electroacoustic resonator according to claim 1, wherein a velocity of a main mode in the trap regions is at most 99% and at least 93% of the velocity of the main mode in the track region.

3. The electroacoustic resonator according to claim 1, wherein a velocity of a main mode in the barrier regions is at most 110% and at least 101% of the velocity of the main mode in the track region.

4. The electroacoustic resonator according to claim 1, wherein
a width of the fingers is greater in the trap regions than in the track region.

5. The electroacoustic resonator according to claim 1, wherein the stub fingers and/or the barrier portions of the fingers are thinner and/or narrower than the track portions of the fingers.

6. The electroacoustic resonator according to claim 1, wherein the stub fingers are shorter than the barrier portions of the fingers.

7. The electroacoustic resonator according to claim 1, wherein a width of the stub fingers matches a width of the barrier portions of the fingers.

8. The electroacoustic resonator according to claim 1, wherein in each electrode, the fingers, and the stub fingers are arranged in an alternating manner.

9. The electroacoustic resonator according to claim 1, wherein each stub finger is located at a same height with respect to a propagation direction of a main mode as a finger of a respective other electrode.

10. An electroacoustic resonator, comprising:
a piezoelectric layer having a top side;
an electrode structure disposed over the top side of the piezoelectric layer, wherein the electrode structure comprises:
a first busbar;
a second busbar parallel to the first busbar;
a first set of electrode fingers extending from the first busbar;
a first set of stub electrode fingers extending from the second busbar toward corresponding electrode fingers of the first set of electrode fingers;

a second set of electrode fingers extending from the second busbar, wherein the first set of electrode fingers and the second set of electrode fingers are interdigitated; and a second set of stub electrode fingers extending from the first busbar toward corresponding electrode fingers of the second set of electrode fingers;

wherein the top side of the piezoelectric layer between the first busbar and the second busbar is subdivided into:

a track region;

a first barrier region adjacent to the first busbar, wherein the first set of stub electrode fingers are positioned within the first barrier region;

a second barrier region adjacent to the second busbar, wherein the second set of stub electrode fingers are positioned within the second barrier region;

a first trap region located between the first barrier region and the track region; and a second trap region located between the second barrier region and the track region;

wherein the first set of stub electrode fingers, the second set of stub electrode fingers, portions of the first set of electrode fingers in the first barrier region, and portions of the second set of electrode fingers in the second barrier region have a first thickness;

wherein portions of the first set of electrode fingers and portions of the second set of electrode fingers in the track region have a second thickness greater than the first thickness; and wherein portions of the first set of electrode fingers and portions of the second set of electrode fingers in the first trap region and the second trap region have a third thickness greater than the second thickness.

* * * * *